United States Patent
Kim et al.

(10) Patent No.: US 7,514,704 B2
(45) Date of Patent: Apr. 7, 2009

(54) PHASE-CHANGE MEMORY DEVICE AND METHOD OF MANUFACTURING THE SAME

(75) Inventors: Young-Tae Kim, Suwon-si (KR); Young-Nam Hwang, Gyeonggi-do (KR); Tai-Kyung Kim, Gyeonggi-do (KR); Won-Young Chung, Anywang-si (KR); Keun-Ho Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 439 days.

(21) Appl. No.: 11/028,202

(22) Filed: Jan. 4, 2005

(65) Prior Publication Data

US 2005/0174861 A1 Aug. 11, 2005

(30) Foreign Application Priority Data

Jan. 5, 2004 (KR) ............. 10-2004-0000380

(51) Int. Cl.
*H01L 29/02* (2006.01)
*H01L 47/00* (2006.01)

(52) U.S. Cl. ............... 257/2; 257/214; 257/298; 438/95

(58) Field of Classification Search ........... 257/214, 257/298; 438/95
See application file for complete search history.

(56) References Cited

U.S. PATENT DOCUMENTS

| | | | |
|---|---|---|---|
| 6,531,373 B2 | 3/2003 | Gill et al. | |
| 6,569,705 B2 | 5/2003 | Chiang et al. | |
| 7,214,632 B2 * | 5/2007 | Chiang | 438/593 |
| 7,307,269 B2 * | 12/2007 | Kim et al. | 257/2 |
| 2002/0036931 A1 | 3/2002 | Lowrey et al. | |
| 2002/0190289 A1* | 12/2002 | Harshfield et al. | 257/295 |
| 2003/0073295 A1 | 4/2003 | Xu | |
| 2003/0122166 A1 | 7/2003 | Lai | |
| 2003/0151041 A1* | 8/2003 | Chiang | 257/3 |
| 2003/0155606 A1* | 8/2003 | Campbell et al. | 257/314 |
| 2003/0193053 A1* | 10/2003 | Gilton | 257/72 |
| 2003/0209746 A1* | 11/2003 | Horii | 257/295 |
| 2004/0113181 A1* | 6/2004 | Wicker | 257/246 |
| 2004/0113192 A1* | 6/2004 | Wicker | 257/298 |
| 2005/0205964 A1* | 9/2005 | Chen | 257/528 |
| 2007/0235712 A1* | 10/2007 | Harshfield et al. | 257/5 |

FOREIGN PATENT DOCUMENTS

KR 2003-0086820 A 11/2003

* cited by examiner

*Primary Examiner*—Dao H Nguyen
*Assistant Examiner*—Tram H Nguyen
(74) *Attorney, Agent, or Firm*—Harness, Dickey & Pierce P.L.C.

(57) ABSTRACT

In a method of forming a phase-change memory device, a variable resistance member may be formed on a s semiconductor substrate having a contact region, and a first electrode may be formed to contact a first portion of the variable resistance member and to be electrically connected to the contact region. A second electrode may be formed so as to contact a second portion of the variable resistance member.

11 Claims, 19 Drawing Sheets

PHASE-CHANGE MEMORY DEVICE AND METHOD OF MANUFACTURING THE SAME

CROSS REFERENCE TO RELATED APPLICATIONS

This application claims priority under 35 U.S.C. § 119 to Korean Patent Application No. 2004-380, filed on Jan. 5, 2004, the contents of which are incorporated herein by reference in its entirety.

BACKGROUND OF THE INVENTION

1. Field of the Invention

The present invention relates in general to a phase-change memory device and a method of manufacturing the phase-change memory device.

2. Description of the Related Art

As information technology rapidly develops, semiconductor devices having substantially high response speed, substantially large storage capacity and substantially low power consumption are desired for portable communication devices designed to process a substantial amount of data. For example, these semiconductor devices may have the high response speed of a static random access memory (SRAM) device, non-volatile characteristics of a flash memory device, and high integration degree of a dynamic random access memory (DRAM) device, even though the semiconductor device may operate with low power consumption than a SRAM, flash memory and/or DRAM device.

Recently, research has begun in earnest into developing memory devices such as a ferroelectric random access memory (FRAM) device, a magnetic random access memory (MRAM) device, a phase-change random access memory (PRAM) device and nano-floating gate memory (NFGM) device, since these memory devices may operate with substantially lower power consumption and may exhibit desired characteristics as related to writing data thereto, reading data therefrom and maintaining data therein. Among those memory devices, attention from a development and/or research perspective has become focused on the PRAM device, because the PRAM device has a relatively high degree of integration and high response speed, etc., while having a relatively simple construction. Additionally, the PRAM device may be manufactured at a relatively lower cost as compared to other memory devices.

A phase-change memory device may include phase-change material having a crystalline structure that may vary in accordance with a heat generated by a current applied to the phase-change material. Phase-change material employed for the phase-change memory device may includes a chalcogenide material or alloy, for example, such as germanium-antimony-tellurium (Ge—Sb—Te, also referred to as 'GST'). Phase-change material such as GST has a crystalline structure that varies according to a heat caused by an amount and time of a current applied thereto. In general, amorphous GST has a relatively high specific resistance, whereas crystalline GST has a relatively low specific resistance. Due to the resistance variation properties of GST, a phase-change memory device including GST may store data therein.

FIG. 1 is a cross-sectional view illustrating a conventional phase-change memory device. Referring to FIG. 1, the conventional phase-change memory device includes a data store element 47 in an active region of a semiconductor substrate 1 that has an isolation layer 3 thereon to define the active region. Word lines 5 are provided on the semiconductor substrate 1, with a first contact region 7 and a second contact region 9 provided at surface portions of the semiconductor substrate 1 between the word lines 5.

A lower insulating interlayer 21 may include a first insulating interlayer 11 and a second insulating interlayer 19 on the semiconductor substrate 1. A first contact hole 23 may be formed through the lower insulating interlayer 21 to expose the first contact region 7. A storage plug 27 including a first plug 13 and a second plug 25 may be provided in the first contact hole 23. The first plug 13 may be connected to the first contact region 7 and the second plug 25 may be positioned on the first plug 13, as shown in FIG. 1.

A bit line pad 15 contacting the second contact region 9 may be provided through first insulating interlayer 11, with a bit line 17 provided on the bit line pad 15. The second insulating interlayer 19 may be formed on the semiconductor substrate 1 with the bit line 17 formed thereon.

The data store element 47 may be formed on the second insulating interlayer 19 of lower insulating interlayer 21. The data store element 47 may include a first barrier layer pattern 29, a phase-change layer pattern 31 and a protection oxide layer pattern 33. The phase-change layer pattern 31 may be formed of a phase-change material that has two stable phases according to a temperature variation thereof, such as GST, for example. The first barrier layer pattern 29 may be formed of a metal nitride so as not to react with the phase-change layer pattern 31. To prevent an oxidation of the phase-change layer pattern 31, the protection oxide layer pattern 33 may be formed with one of a silicon nitride, boron nitride, silicon carbide or zinc sulfide.

An upper insulating interlayer 35 covers the data store element 47, and a plate electrode contact hole 37 may be formed through the upper insulating interlayer 35 to expose the phase-change layer pattern 31 of the data store element 47. A spacer 39 is provided on an inside of the plate electrode contact hole 37. A second barrier layer pattern 41 of metal nitride may be formed on the upper insulating interlayer 35 to fill the plate electrode contact hole 37. A plate electrode 43 may be formed on the second barrier layer pattern 41.

To write data to the data store element 47 of FIG. 1, a portion of the phase-change layer pattern 31 in contact with the second barrier layer pattern 41 may be converted into a crystalline or amorphous state, as shown FIG. 2A, when a current is applied to the phase-change layer pattern 31 so as to generate heat therein.

The conventional phase-change memory device has a vertical construction in which the first barrier layer pattern 29, phase-change layer pattern 31, second barrier layer pattern 41 and plate electrode 43 are vertically stacked on the semiconductor substrate 1. In this conventional phase-change memory device with vertical construction, a phase-change region generated in a phase-change layer pattern 31 is substantially small. This is because the phase-change region may be formed only at a portion of the phase-change layer pattern 31 that is in contact with an electrode (such as plate electrode 43 via second barrier layer pattern 41). In addition, a relatively high current is applied to the phase-change layer pattern 31 from the electrode so as to generate heat for sufficiently forming phase-change region in the phase-change layer pattern 31. This problem is described in further detail with reference to FIGS. 2A and 2B.

FIG. 2A is a schematic cross-sectional view illustrating the phase-change region of the conventional phase-change memory device of FIG. 1; and FIG. 2B is a schematic cross-sectional view illustrating a temperature distribution of the conventional phase-change memory device of FIG. 1. In FIG. 2B, the temperature distribution of the conventional phase-change memory device is a simulated result obtained using CFD-ACE+ program provided by CFDRC Co. in U.S.A.

Referring to FIGS. 2A and 2B, in the conventional phase-change memory device with vertical construction as shown in FIG. 1, a phase-change region 55 is formed only at a minute portion of a phase-change layer 53 that is in contact with a contact 51 (such as an electrode). Since heat causing specific resistance variation of the phase-change region 55 depends on current applied to the phase-change layer 53 from contact 51, the heat is generated in the phase-change layer 53 centering around an interface between the phase-change layer 53 and the contact 51. That is, a temperature distribution Td causes the heat generated in the phase-change 53 to lean to the contact 51 centering the interface between the phase-change layer 53 and the contact 51 as shown in FIG. 2B. Thus, the heat generated in the phase-change region 55 may be dissipated through the contact 51, because the contact 51 (which may be a metal or a metal nitride, for example) has thermal conductivity about seven (7) times larger than that of the phase-change layer 53 (which may be GST).

As heat dissipation occurs in the phase-change layer 53, more heat is thus required to generate the phase-change region 55 in the phase-change layer 53 so that relatively high reset current is applied to the phase-change layer 53 from the contact 51 (a reset current is applied as part of a reset operation to change state back from a relatively lower specific resistance crystalline state back to a relatively higher specific resistance amorphous state). However, the relatively high reset current may raise power consumption of the phase-change memory device and accelerate deterioration of the phase-change layer 53. Furthermore, because the temperature distribution Td leans toward the contact 51, temperature difference between the phase-change layer 53 and the contact 51 increases so that the phase-change layer 53 may detach from the contact 51.

SUMMARY OF THE INVENTION

An exemplary embodiment of the present invention is directed to a phase-change memory device. The device may include a semiconductor substrate having a contact region with a variable resistance member provided on the semiconductor substrate. The device may include a first electrode contacting a first portion of the variable resistance member and electrically connected to the contact region, and a second electrode contacting a second portion of the variable resistance member.

Another exemplary embodiment of the present invention is directed to a method of manufacturing a phase-change memory device. In the method, a variable resistance member may be formed on a semiconductor substrate having a contact region, and a first electrode may be formed to contact a first portion of the variable resistance member and to be electrically connected to the contact region. A second electrode may be formed so as to contact a second portion of the variable resistance member.

Another exemplary embodiment of the present invention is directed to a phase-change memory device. The device may include a semiconductor substrate having a contact region, with a lower wiring provided on the semiconductor substrate and in contact with the contact region, and with a variable resistance member provided on the semiconductor substrate and separated from the lower wiring. The device may include a first electrode contacting a first portion of the variable resistance member and electrically connected to the lower wiring, a second electrode contacting a second portion of the variable resistance member and a portion of an adjacent variable resistance member, and an upper wiring electrically connected to the second electrode.

Another exemplary embodiment of the present invention is directed to a method of manufacturing a phase-change memory device. In the method, a contact region may be formed on a semiconductor substrate, and a lower wiring may be formed on the semiconductor substrate to electrically contact the contact region. A variable resistance member may be formed on the semiconductor substrate so as to be separated from the lower wiring. A first electrode may be formed so as to be electrically connected to the lower wiring and to contact a first portion of the variable resistance member, and a second electrode may be formed that contacts a second portion of the variable resistance member and a portion of an adjacent variable resistance member. An upper wiring may be formed to be electrically connected to the second electrode.

Another exemplary embodiment of the present invention is directed to a phase-change memory device. The device may include a semiconductor substrate having a contact region, a first electrode electrically connected to the contact region and a second electrode. The device may include a variable resistance member provided between the first and second electrodes, the first and second electrodes positioned on sidewalls of the variable resistance member so as to enclose lateral portions of the variable resistance member.

Another exemplary embodiment of the present invention is directed to a phase-change memory device arrangement including two adjacent phase-change memory devices sharing a common semiconductor substrate. Each memory device may include a first electrode and a variable resistance member and may share a common second electrode between the corresponding first electrodes. Each variable resistance member may be provided between a corresponding first electrode and the common second electrode so that a portion of the common second electrode encloses a first lateral portion of each of the two adjacent variable resistance members.

Another exemplary embodiment of the present invention is directed to a method of manufacturing a phase-change memory device. A variable resistance member may be formed on a semiconductor substrate having a contact region. A first electrode may be formed so as to enclose a first lateral portion of the variable resistance member, the first electrode being electrically connected to the contact region. A second electrode may be formed so as to enclose a second lateral portion of the variable resistance member.

BRIEF DESCRIPTION OF THE DRAWINGS

The present invention will become more apparent by describing, in detail, exemplary embodiments thereof with reference to the attached drawings, wherein like elements are represented by like reference numerals, which are given by way of illustration only and thus do not limit the exemplary embodiments of the present invention.

FIGS. 7A to 7I are cross-sectional views illustrating a method of manufacturing a phase-change memory device in accordance with an exemplary embodiment of the present invention.

DETAILED DESCRIPTION OF THE EXEMPLARY EMBODIMENTS

Figure 1:
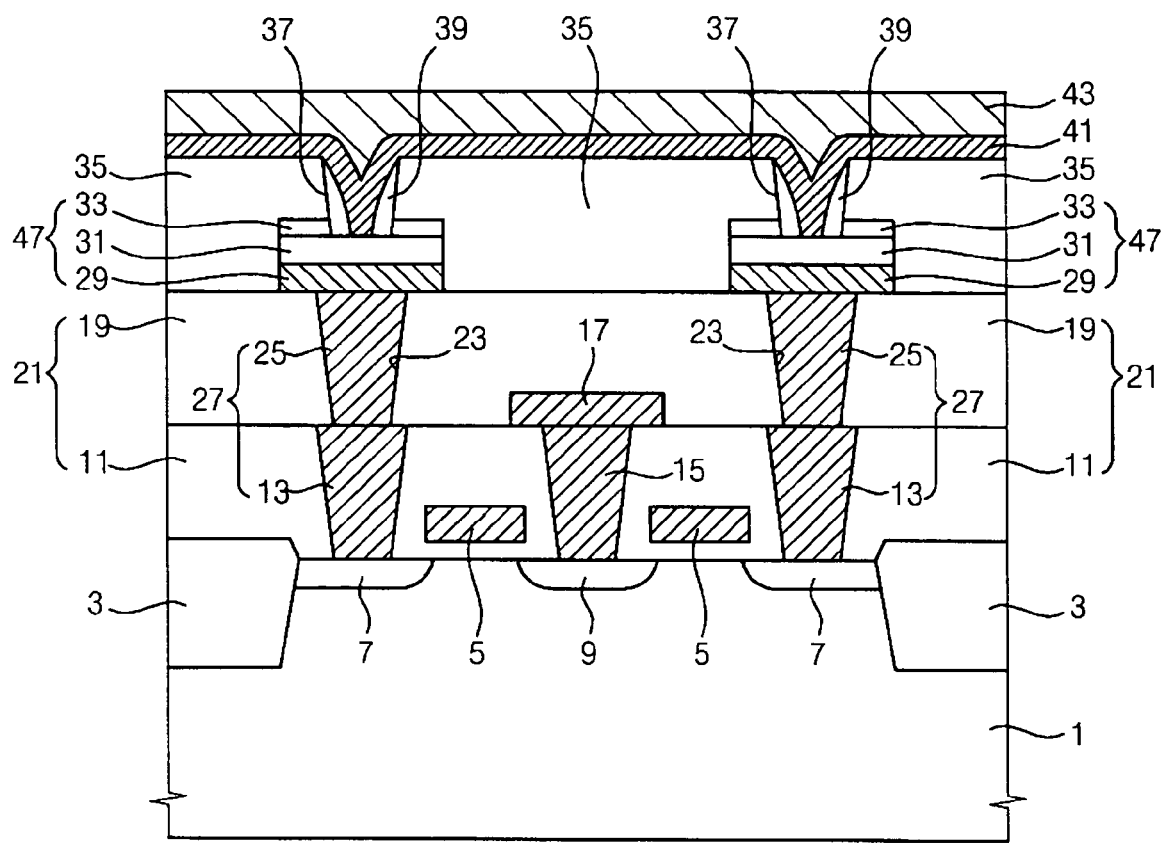
FIG. 1 is a cross-sectional view illustrating a conventional phase-change memory device.

The present invention now will be described more fully hereinafter with reference to the accompanying drawings, in which exemplary embodiments of the invention are shown. The present invention may, however, be embodied in many different forms and should not be construed as limited to the exemplary embodiments set forth herein; rather, these exemplary embodiments are provided so that this disclosure will be through and complete, and will fully convey the scope of the invention to those skilled in the art. In the drawings, the thickness of layers and regions may be exaggerated for clarity. Like reference numerals refer to similar or identical elements throughout. It will be understood that when an element such as a layer, region or substrate is referred to as being "on" or "onto" another element, it may be directly on the other element or intervening elements may also be present there between.

Figure 3:
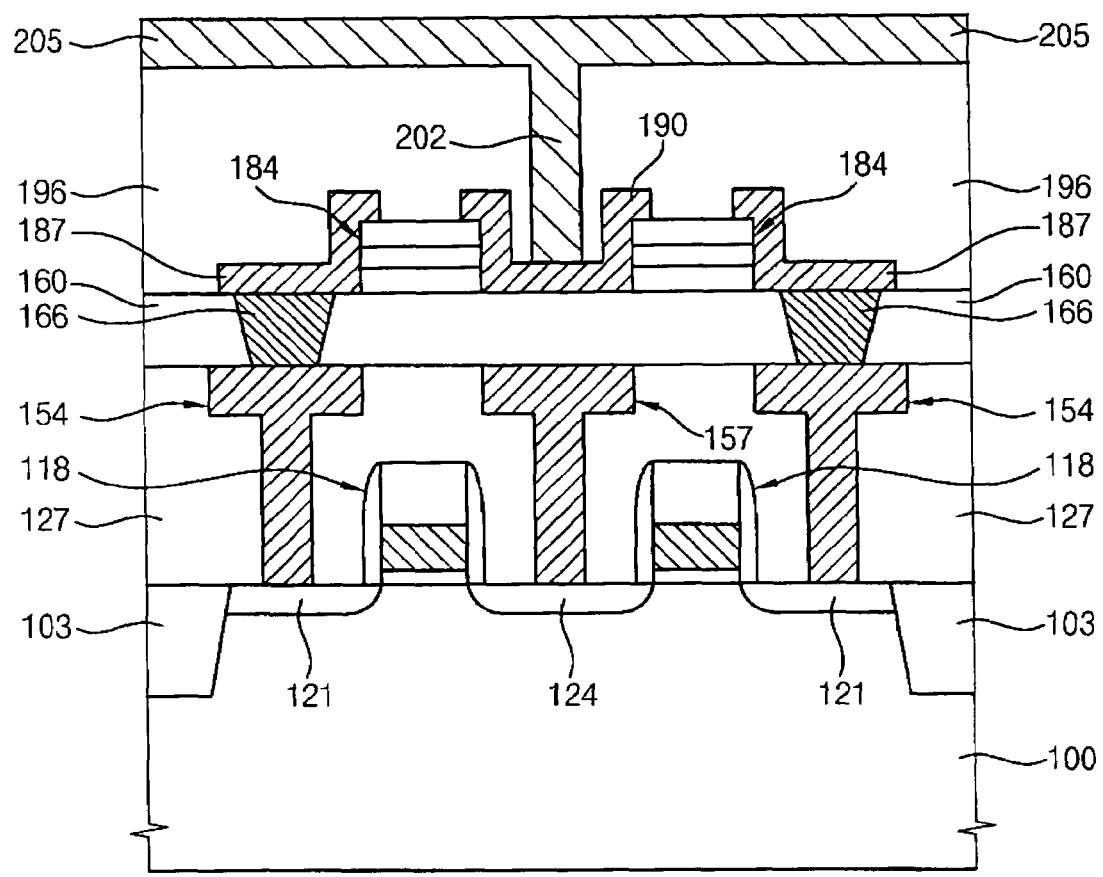
FIG. 3 is a cross-sectional view illustrating a phase-memory device in accordance with an exemplary embodiment of the present invention.

FIG. 3 is a cross-sectional view illustrating a phase-memory device in accordance with one embodiment of the present invention. Additionally hereafter, occasional reference may be made to FIGS. 7A, 7C and 7F in describing FIG. 3. Referring to FIG. 3, the exemplary phase-change memory device may include a semiconductor substrate 100 having a first contact region 121 and a second contact region 124, a first lower wiring 154, a second lower wiring 157, a first electrode 187, a second electrode 190, and a variable resistance member 184. The first and second lower wirings 154 and 157 may be configured so as to make contact with the first and second contact regions 121 and 124. The first electrode 187 may be electrically connected to the first lower wiring 154. The second electrode 190 may be arranged adjacent to the first electrode 187, with variable resistance member 184 formed between the first and second electrodes 187 and 190 and arranged in a direction parallel to the substrate 100, as shown in FIG. 3, for example.

An isolation layer 103 may be formed on the semiconductor substrate 100 to define an active region thereon. Underlying structures, for example gate structures 118, may be formed in the active region of the substrate 100.

Figure 7A:
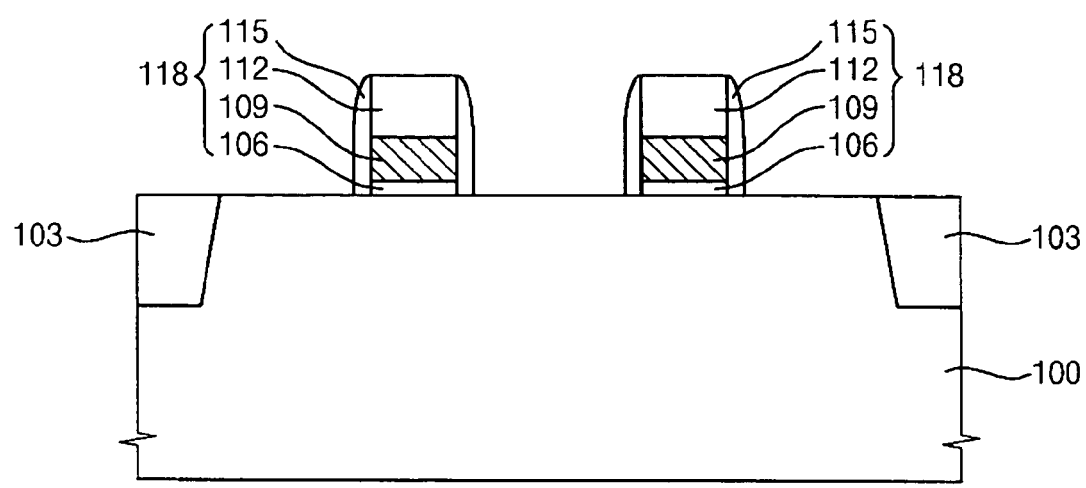

The first and second contact regions 121 and 124 may be formed at portions of the substrate 100 that are exposed between the underlying gate structures 118. Each of the gate structures 118 may include a gate oxide layer pattern 106, a gate conductive layer pattern 109, a gate mask 112 and a spacer 115, as shown in FIG. 7A. The gate oxide layer pattern 106, the gate conductive layer pattern 109 and the gate mask 112 may be sequentially formed on the substrate 100. Additionally, the spacer 115 may be formed on sidewalls of the gate oxide layer pattern 106, the gate conductive layer pattern 109 and the gate mask 112, as shown in FIG. 7A.

A first insulating interlayer 127 may be formed on the substrate 100 to cover the underlying gate structures 118. The first and second lower wirings 154 and 157 may make contact with corresponding first and second contact regions 121 and 124 via first insulating interlayer 127. That is, given holes or openings may be formed through the first insulating interlayer 127 and filled with the first and second lower wirings 154 and 157, thereby connecting the first and second lower wirings 154 and 157 to the first and second contact regions 121 and 124. The first insulating interlayer 127 may be formed of one of tetra ethyl ortho silicate (TEOS), undoped silicate glass (USG), spin on glass (SOG), high density plasma-chemical vapor deposition (HDP-CVD) oxide, etc., or combinations of one or more of these materials.

Figure 7B:
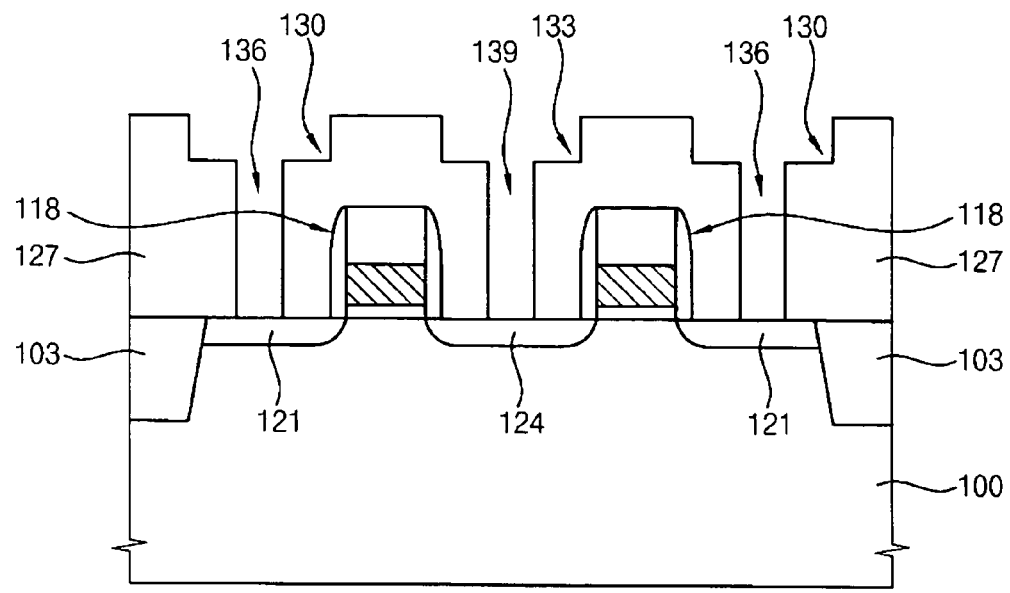
Figure 7C:
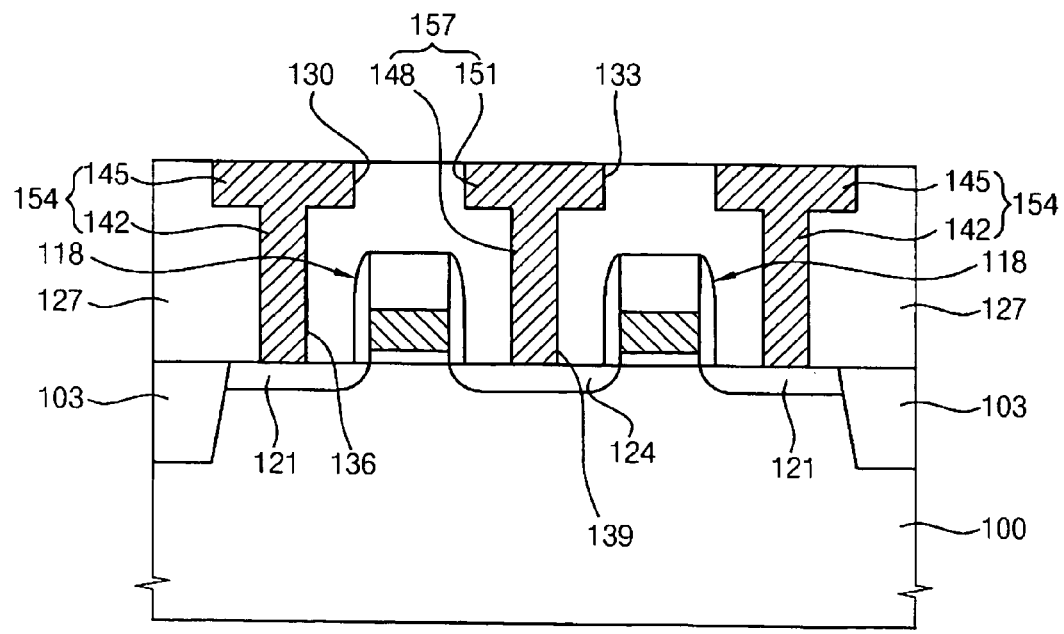

In an example, the first lower wiring 154 may include a first plug 142 formed on the first contact region 121 and a first pad 145 formed on the first plug 142, as shown in FIG. 7C. Also, the second lower wiring 157 may include a second plug 148 formed on the second contact region 124 with a second pad 151 formed on the second plug 148. The first and second lower wirings 154 and 157 may be formed of a conductive material such as polysilicon doped with impurities or a metal, for example, tungsten (W), aluminum (Al), tantalum (Ta), copper (Cu), etc., or combinations of one or more of these materials.

A second insulating interlayer 160 may be formed on the first insulating interlayer 127 with the first and second lower wirings 154 and 157 formed through second insulating layer 160. A third plug 166 in contact with the first lower wiring 154 may also be formed through the second insulating interlayer 160. The second insulating interlayer 160 may be formed of TEOS, USG, SOG, HDP-CVD oxide, etc, or combination thereof. The third plug 166 may be formed of conductive materials such as doped polysilicon or a metal, and/or combinations thereof. For example, the third plug 166 may be formed using W, Al, Ta, Cu or a combination thereof.

As shown in FIG. 3, the first electrode 187 may be electrically connected to the first lower wiring 154 via the third plug 166, and the second electrode 190 may be electrically connected to an upper wiring 205 via a fourth pad 202. the first and second electrodes 187 and 190 may be formed by interposing the variable resistance member 184 therebetween, and also may be arranged in the direction parallel to the substrate 100. As shown in FIG. 3, first electrode 187, second electrode 190 and variable resistance member 184 are arranged on a common surface (second insulating layer 160) parallel to semiconductor substrate 100. Portions of the first and second electrodes 187 and 190 may be positioned on sidewalls of the variable resistance member 184 to enclose lateral portions of the variable resistance member 184. As shown in FIG. 3, two first electrodes 187 share a common second electrode 190. That is, two adjacent phase-change memory devices share a common second electrode 190, but each phase-change memory devices include first electrodes 187. The second electrode 190 may have a generally U-shaped cross section that encloses lateral portions of two adjacent variable resistance members 184.

The first and second electrodes 187 and 190 may include a conductive material containing nitrogen (N), a metal, a metal silicide, etc. Exemplary conductive materials containing nitrogen may include titanium nitride (TiN), tantalum nitride (TaN), molybdenum nitride (MoN), niobium nitride (NbN), titanium-silicon nitride (TiSiN), titanium-aluminum nitride (TiAlN), titanium-boron nitride (TiBN), zirconium-silicon nitride (ZrSiN), tungsten-silicon nitride (WSiN), tungsten-boron nitride (WBN), zirconium-aluminum nitride (ZrAlN), molybdenum-silicon nitride (MoSiN), molybdenum-aluminum nitride (MoAlN), tantalum-silicon nitride (TaSiN), tantalum-aluminum nitride (TaAlN), titanium oxynitride (TiON), titanium-aluminum oxynitride (TiAlON), tungsten oxynitride (WON), tantalum oxynitride (TaON), etc. The first and second electrodes 187 and 190 may include one of the above conductive materials or combinations/mixtures thereof. Examples of suitable conductive metals for the first and second electrodes 187 and 190 may include one of titanium, tungsten, molybdenum or tantalum, and examples of suitable metal silicides for the first and second electrodes 187 and 190 include titanium silicide (TiSi) or tantalum silicide (TaSi), or mixtures of one or more of these metals and/or metal silicides.

The first and second electrodes 187 and 190 may each be embodied as of single layer structures composed of a material containing nitrogen, metal, metal silicide, etc. Alternatively, the first and second electrodes 187 and 190 may have double layer structures of materials containing nitrogen, metal and metal silicide, for example.

Figure 7D:
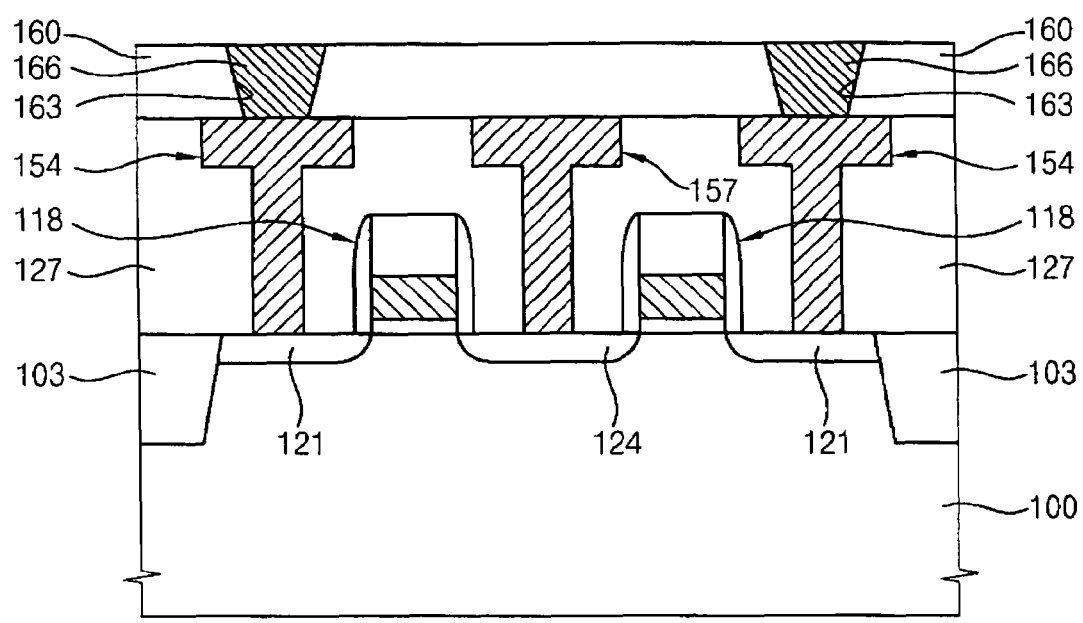
Figure 7E:
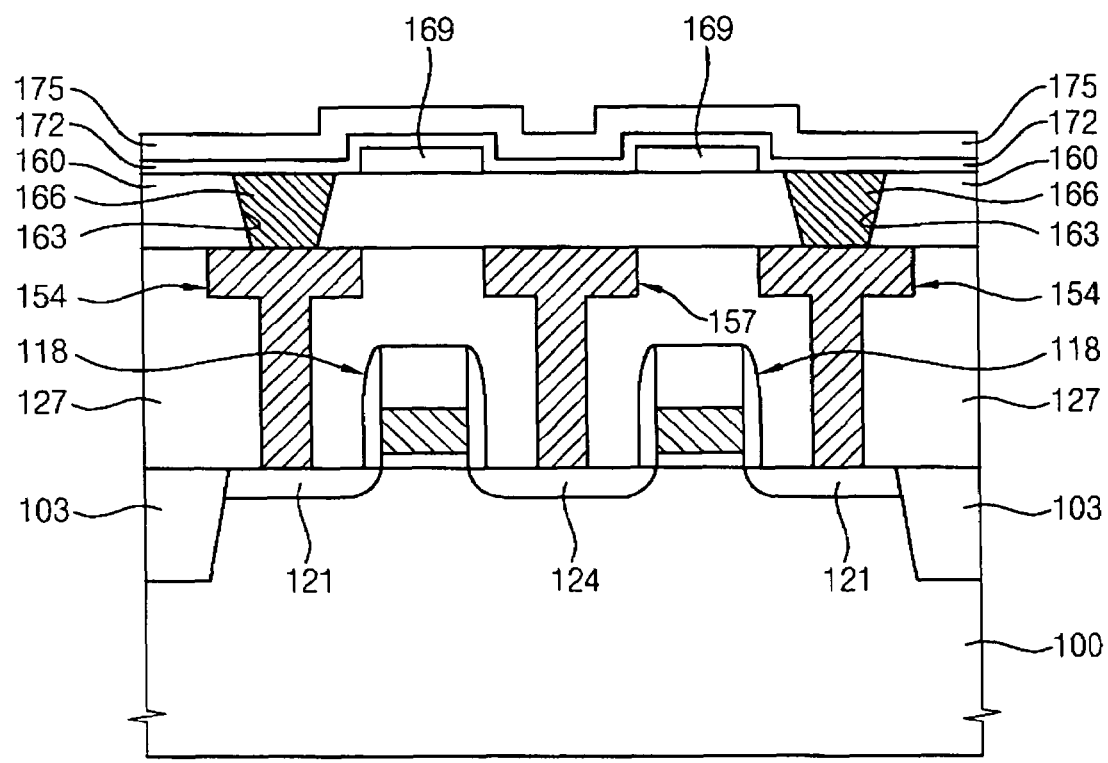
Figure 7F:
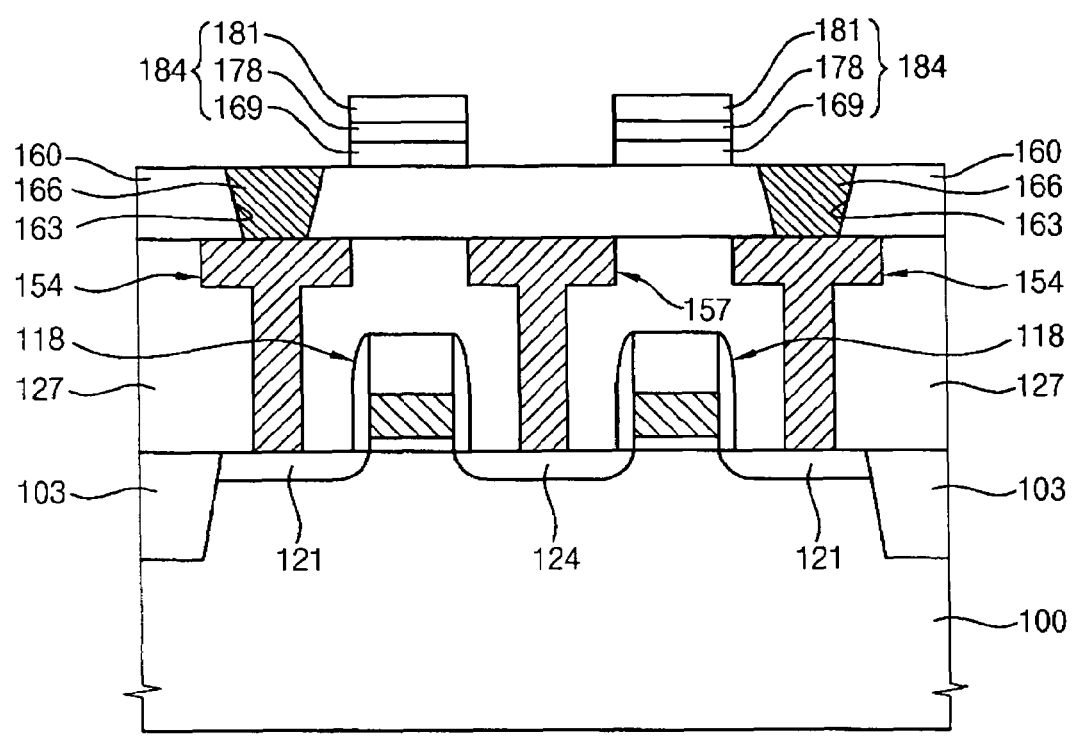

The variable resistance member 184 may include a first insulation layer pattern 169, a phase-change layer pattern 178 and a second insulation layer pattern 181 as shown in FIG. 7F. The first insulation layer pattern 169, the phase-change layer pattern 178, and the second insulation layer pattern 181 may be successively formed on the second insulating interlayer 160.

The first and second insulation layer patterns 169 and 181 may include oxide such as silicon oxide or nitride such as silicon nitride. The phase-change layer pattern 178 may include a chalcogenide. For example, the phase-change layer pattern 178 may include chalcogenide alloys such as germanium-antimony-tellurium (Ge—Sb—Te), arsenic-antimony-tellurium (As—Sb—Te), tin-antimony-tellurium (Sn—Sb—Te), or tin-indium-antimony-tellurium (Sn—In—Sb—Te), arsenic-germanium-antimony-tellurium (As—Ge—Sb—Te). Alternatively, the phase-change layer pattern 178 may include an element in Group VA-antimony-tellurium such as tantalum-antimony-tellurium (Ta—Sb—Te), niobium-antimony-tellurium (Nb—Sb—Te) or vanadium-antimony-tellurium (V—Sb—Te) or an element in Group VA-antimony-selenium such as tantalum-antimony-selenium (Ta—Sb—Se), niobium-antimony-selenium (Nb—Sb—Se) or vanadium-antimony-selenium (V—Sb—Se). Further, the phase-change layer pattern 178 may include an element in Group VIA-antimony-tellurium such as tungsten-antimony-tellurium (W—Sb—Te), molybdenum-antimony-tellurium (Mo—Sb—Te), or chrome-antimony-tellurium (Cr—Sb—Te) or an element in Group VIA-antimony-selenium such as tungsten-antimony-selenium (W—Sb—Se), molybdenum-antimony-selenium (Mo—Sb—Se) or chrome-antimony-selenium (Cr—Sb—Se).

Although the phase-change layer pattern 178 is described above as being formed primarily of ternary phase-change chalcogenide alloys, the chalcogenide alloy of the phase-change layer pattern 178 could be selected from a binary phase-change chalcogenide alloy or a quarternary phase-change chalcogenide alloy. Exemplary binary phase-change chalcogenide alloys may include one or more of Ga—Sb, In—Sb, In—Se, $Sb_2$—$Te_3$ or Ge—Te alloys; exemplary quarternary phase-change chalcogenide alloys may include one or more of an Ag—In—Sb—Te, (Ge—Sn)—Sb—Te, Ge—Sb—(Se—Te) or $Te_{81}$—$Ge_{15}$—$Sb_2$—$S_2$ alloy, for example.

In an example, the variable resistance member 184 may have a rectangular box structure (i.e., be shaped generally in the shape of a box). As heat is generated in the phase-change layer pattern 178 due to a current applied thereto through the first electrode 187, the first and second insulation layer patterns 169 and 181 confine the heat to the phase-change layer pattern 178. That is, the variable resistance member 184 may have a heat-confining ability in which the heat due to the applied current is confined within the phase-change layer pattern 178 heat dissipation from the phase-change layer pattern 178. This may be possible since upper and lower portions of the phase-change layer pattern 178 are enclosed by first and second insulation layer patterns 169 and 181.

Figure 4:
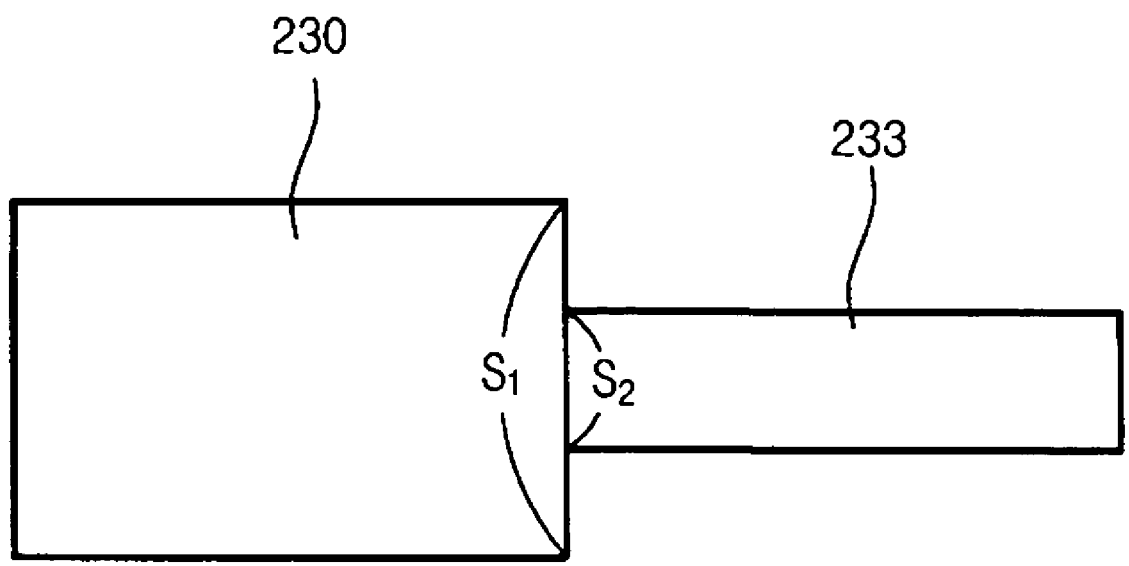
FIG. 4 is a cross-sectional view illustrating a phase-change mechanism of a phase-change memory device in accordance with an exemplary embodiment of the present invention.

FIG. 4 is a cross-sectional view illustrating a phase-change mechanism of a phase-change memory device in accordance with an exemplary embodiment of the present invention.

Referring to FIG. 4, a phase-change layer pattern 233 is shown horizontally contacting an electrode 230. Here, the electrode 230 may have a cross-sectional area S1 substantially larger than a cross-sectional area S2 of the phase-change layer pattern 233. Since the cross-sectional area S2 of the phase-change layer pattern 233 is narrower than the cross-sectional area S1 of the electrode 230, density of a current applied from the electrode 230 may be high at the cross-section of the phase-change layer pattern 233. Additionally, heat caused by a reset current may be confined in the phase-change layer pattern 233 without a dissipation of heat from the phase-change layer pattern 233 to thereby efficiently form a phase-change region in the phase-change layer pattern 233. In other words, the phase-change layer pattern 233 of the present invention has a 'self-heat confined' structure in which the heat for forming the phase-change region may be confined in the phase-change layer pattern 233. This is because the phase-change region of the phase-change layer pattern 233 is separated from the electrode 230 and the cross-sectional area S2 of the phase-change layer pattern 233 is substantially smaller than that of the electrode 230. This may enable the exemplary phase-change memory device to use a reset current that may be considerably lower than the rest current required of the conventional phase-change memory device.

Figure 5A:
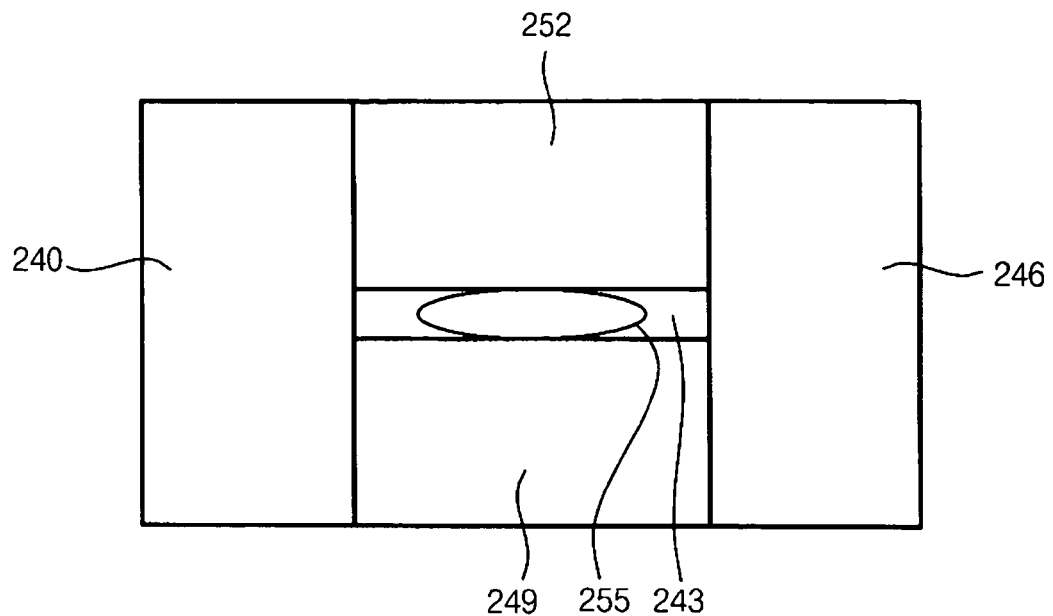
FIG. 5A is a cross-sectional view illustrating a thermal distribution of a phase-change memory device in accordance with an exemplary embodiment of the present invention.
Figure 5B:
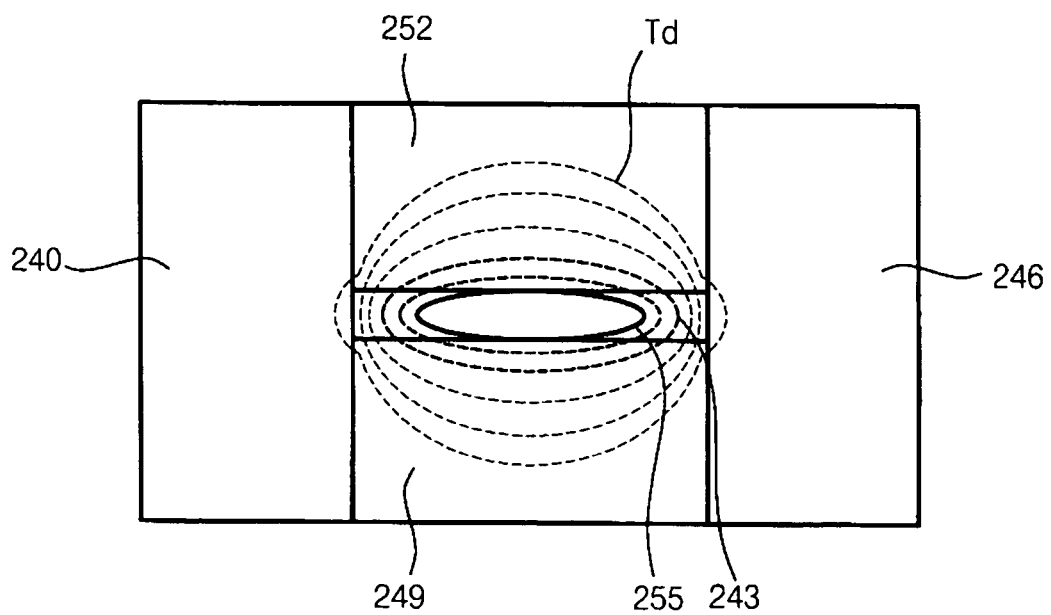
FIG. 5B is a cross-sectional view illustrating a temperature distribution of a phase-change memory device in accordance with an exemplary embodiment of the present invention.

FIG. 5A is a cross-sectional view illustrating a phase-change region of a phase-change memory device in accordance with one embodiment of the present invention, and FIG. 5B is a cross-sectional view illustrating a temperature distribution of the phase-change memory device in accordance with one embodiment of the present invention. FIGS. 5A and 5B are provided to describe the phase-change mechanism of the phase-change memory device.

In FIG. 5B, the temperature distribution of the phase-change memory device may be shown as a simulated result obtained using CFD-ACE+ program provided by CFDRC Co. in U.S.A., for example. Referring to FIGS. 5A and 5B, the exemplary phase-change memory device may include a first electrode 240, a phase-change layer 243 and a second electrode 246 which are horizontally disposed over a substrate. To prevent dissipation of heat generated in the phase-change layer 243, a first insulation pattern 249 and a second insulation pattern 252 may be formed on upper face of the phase-change layer 243 and beneath a bottom face of the phase-change layer 243. If the first and second electrodes 240 and 246 are formed of titanium nitride and the phase-change layer 243 is formed of GST, the current density of the current applied from the first and second electrodes 240 and 246 increases in the phase-change layer 243 because the phase-change layer 243 has a cross-sectional area substantially smaller than those of the first and second electrodes 240 and 246. In addition, a phase-change region may be formed from a central portion of the phase-change layer 243 toward the first and second electrodes 240 and 246. As shown in FIG. 5B, heat for forming a phase-change region 255 does not dissipate from the phase-change layer 243 because a temperature distribution Td is uniform substantially centering the phase-change region 255 in a central portion of the phase-change layer 243.

Figure 2A:
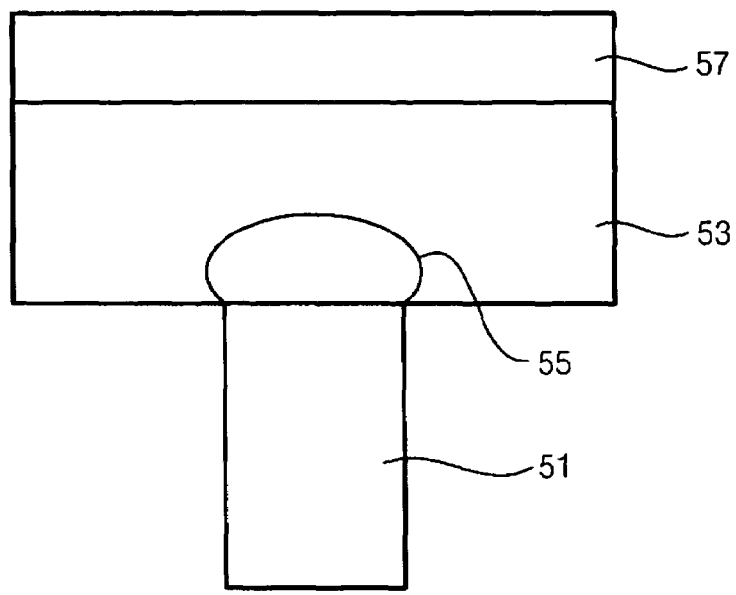
FIGS. 2A and 2B are schematic cross-sectional views illustrating a phase-change region of the conventional phase-change memory device.
Figure 2B:
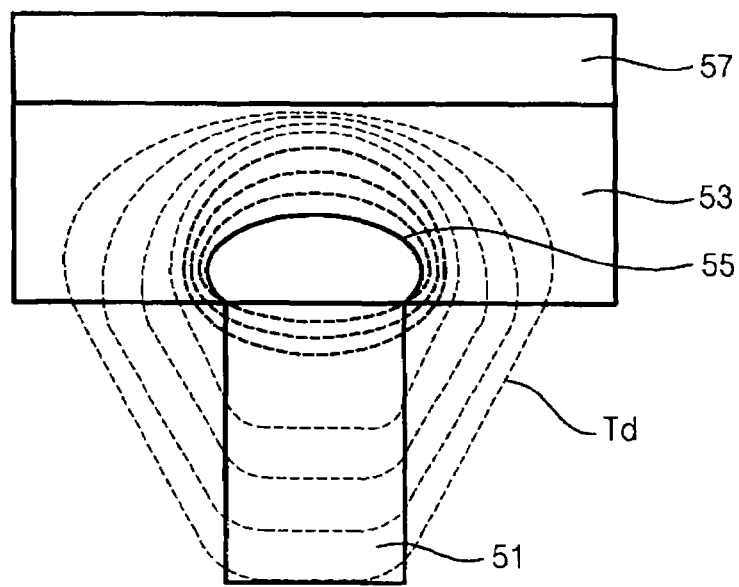

In the conventional phase-change memory device of FIGS. 2A and 2B, heat for forming the phase-change region 55 is dissipated through the contact 51. Thus, additional, higher reset current is required to sufficiently form the desired phase-change region 55 within the phase-change layer pattern 31. However, in the exemplary phase-change memory device, as evident by FIG. 5B, the phase-change region 243 may be formed in a generally central portion of the phase-change layer 243. This may be possible because the heat due to a reset current is confined in the phase-change layer 243 and separated from the first and second electrodes 240 and 246 by a given interval. Therefore, the phase-change memory device in accordance with the exemplary embodiments of the present invention may form the phase-change region 255 with a reset current that is substantially lower than that of the conventional phase-change memory device. Also, since the first and second insulation patterns 249 and 252 are respectively formed on the upper face and beneath the bottom face of the phase-change layer 243, the first and second insulation layer patterns 249 and 252 may additionally confine the heat generated in the phase-change layer 243 without dissipation of heat.

Figure 6:
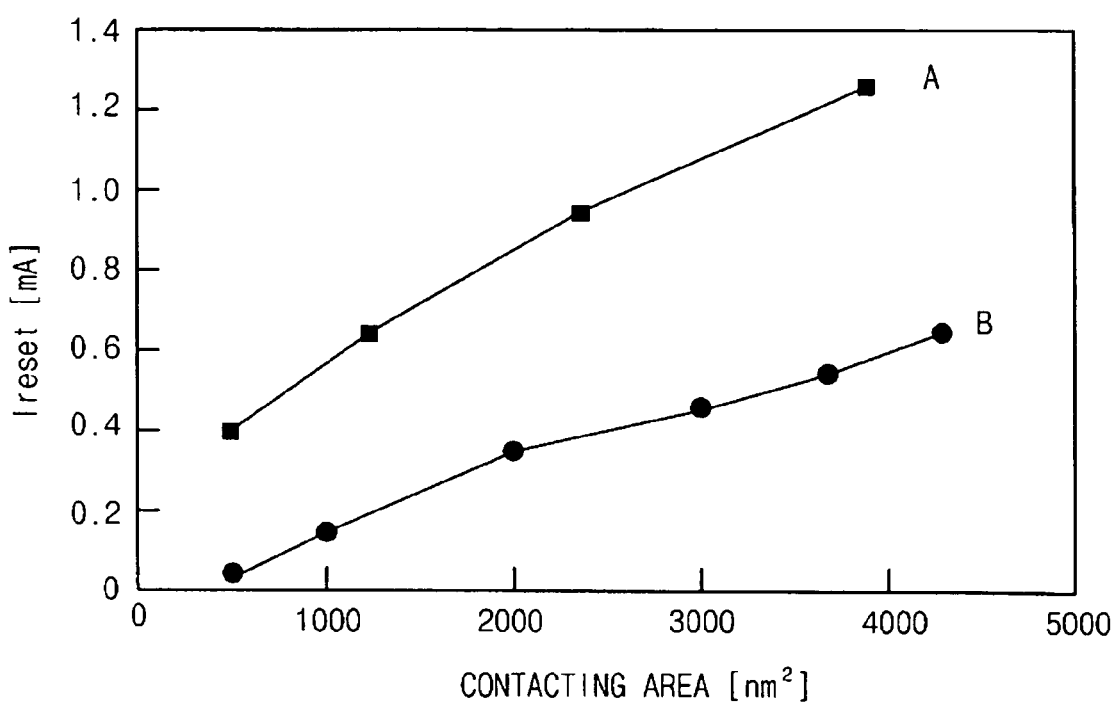
FIG. 6 is a graph illustrating reset current relative to areas of contact regions of a conventional phase-change memory device and a phase-change memory device in accordance with an exemplary embodiment of the present invention.

FIG. 6 is a graph illustrating reset currents relative to contact areas to compare the phase-change memory device of the present invention with a conventional phase-change memory device. In FIG. 6, the reset current of the phase-change memory device was obtained by varying a width of a phase-change layer having a length of about 200 nm and a thickness of about 30 nm.

Referring to FIG. 6, when the phase-change layer has a cross-sectional area substantially identical to that of an electrode, the phase-change memory device of the present invention (shown by curve B) may be operated using a reset current less than half of that used in the conventional phase-change memory device (shown by curve A).

Referring now to FIG. 3, a third insulating interlayer 196 may be provided on the second insulating interlayer 160 to cover the variable resistance member 184, first electrode 187 and second electrode 190. An upper wiring 205 may be provided on the third insulating interlayer 196. The upper wiring 205 is electrically connected to the second electrode 190 through a fourth plug 202 formed through the third insulating interlayer 196. The fourth plug 202 and the upper wiring 205 may include a conductive material such as doped polysilicon, tungsten, aluminum, copper, tantalum, etc., and/or mixtures of one or more of these conductive materials.

FIGS. 7A to 7I are cross-sectional views illustrating a phase-change memory device in accordance with one embodiment of the present invention. Hereinafter, a method of manufacturing a phase-change memory device will be described with reference to the FIGS. 7A to 7I.

Referring to FIG. 7A, an isolation layer 103 may be formed on a semiconductor substrate 100 to define an active region on the semiconductor substrate 100. The isolation layer 103 may be formed by a shallow trench isolation (STI) process or a local oxidation of silicon (LOCOS) process, for example, although it is evident to those of ordinary skill in the art that other known processes could be used to form isolation layer 103.

A gate oxide layer, gate conductive layer and gate mask layer may be sequentially formed on the active region of the semiconductor substrate 100, and then successively patterned by a photolithographic process, thereby forming a gate oxide layer pattern 106, a gate conductive layer pattern 109 and a gate mask 112 on the semiconductor substrate 100. The gate conductive layer may have a single layer structure of polysilicon doped with impurities or metal, or alternatively may have a double layer construction including polysilicon doped with impurities and a metal. The gate mask layer may be formed using material that has an etching selectivity relative to oxide. For example, the gate mask layer may be formed using nitride such as silicon nitride (SiN).

In an example, the gate mask layer may be partially etched by a photolithography process to form the gate mask 112 on the gate conductive layer. Then, the gate conductive layer and the gate oxide layer may be partially etched using the gate mask 112 as an etching mask to thereby form the gate conductive layer pattern 109 and the gate oxide layer pattern 106.

A nitride layer including silicon nitride may be formed on the semiconductor substrate 100 to cover the gate mask 112. The nitride layer may be partially etched to form a gate spacer 115 on a sidewall of a gate structure 118 that includes the gate oxide layer pattern 106, the gate conductive layer pattern 109 and the gate mask 112. The gate spacer 115 may be formed by anisotropically etching the nitride layer, for example.

Referring to FIG. 7B, a first contact region 121 and a second contact region 124 may be formed at portions of the semiconductor substrate 100 exposed between the gate structures 118 using the gate structures 118 as ion implantation masks. That is, the first contact region 121 (corresponding to a source region) and second contact region 124 (corresponding to a drain region) may be formed by implanting impurities into the portions of the substrate 100 and thermally treating the implanted impurities. Accordingly, transistors including the gate structures 118 and the first and second contact regions 121 and 124 may thus be formed on the semiconductor substrate 100, with the first contact region 121 representing the source region of the transistor and the second contract region 124 representing the drain region of the transistor.

A first insulating interlayer 127 may be formed on the substrate 100 to substantially cover the transistors. The first insulating interlayer 127 may be composed of oxides such as tetra ethyl ortho silicate (TEOS), undoped silicate glass (USG), spin on glass (SOG), high density plasma-chemical vapor deposition (HDP-CVD) oxide, etc. These can be used alone or in a mixture thereof. In an example, the first insulating interlayer 127 may be planarized by a chemical mechanical polishing (CMP) process, an etch back process, or a combination process of a CMP and an etch back.

The first insulating interlayer 127 may be partially etched by a photolithographic process to form a first opening 130 and a second opening 133 through portions of the first insulating interlayer 127 below which the first and second contact regions 121 and 124 are positioned. The portions of the first insulating interlayer 127 including the first and second openings 130 and 133 may be successively etched to thereby form a first contact hole 136 and a second contact hole 139 exposing corresponding first and second contact regions 121 and 124. Alternatively, after spacers are formed on insides of the first and second openings 130 and 133 with a material having an etching selectivity relative to oxide, portions of the first insulating interlayer 127 may be etched by a self-alignment process relative to the spacers to form first and second contact holes 136 and 139 exposing the first and second contact regions 121 and 124.

Referring to FIG. 7C, a first conductive layer may be formed on the first insulating interlayer 127 to fill the first and second contact holes 136 and 139 and to simultaneously fill the first and second openings 130 and 133. The first conductive layer may be formed with a conductive material such as doped polysilicon or metal like copper, tantalum, tungsten, aluminum, etc., singly or as a combination of on or more of these materials.

Using a chemical mechanical polishing (CMP) process, an etch back process or a combination process of a CMP and an etch back, for example, the first conductive layer is partially removed until the first insulating layer 127 is exposed. Thus, a first plug 141 may be formed in the first contact hole 136 and a first pad 143 may be formed in the first opening 130. At the same time, a second plug 148 and a second pad 151 may be formed in the second contact hole 139 and the second opening 133.

As a result, a first lower wiring 154 may be formed so as to contact the first contact region 121 and a second lower wiring 157 may be formed so as to contact the second contact region 124. The first lower wiring 154 includes the first plug 142 formed on the first contact region 121 and the first pad 145 formed on the first plug 142. The second lower wiring 157 includes the second plug 148 formed on the second contact region 124 and the second pad 151 formed on the second plug 148. The first electrode 187 (see FIG. 7G) may be successively formed so as to be electrically connected to the first contact region 121 through the first pad 145 and the first plug 142.

In an example, the first and second contact holes 136 and 139 may be directly formed through the first insulating interlayer 127 to expose corresponding first and second contact regions 121 and 124 without forming the first and second openings 130 and 133. Then, the first and second contact holes 136 and 139 may be filled with a conductive material, thereby forming the first and second plugs 142 and 148. Here, the first and second lower wirings 154 and 157 may include corresponding first and second plugs 142 and 148, except the first and second pads 145 and 151.

Referring to FIG. 7D, the second insulating interlayer 160 may be formed on the first insulating interlayer 127 where the first and second lower wirings 154 and 157 are formed. The second insulating interlayer 160 may be formed with one of TEOS, USG, SOG, HDP-CVD oxide, etc., and/or combinations of one or more of these materials. The second insulating interlayer 160 may be partially etched by a photolithographic process to form a third contact hole 163 exposing the first pad 145 of the first lower wiring 154 through the second insulating interlayer 160.

A second conductive layer may be formed on the second insulating interlayer 160 to fill the third contact hole 163. The second conductive layer may be formed with a conductive material such as doped polysilicon, with a metal such as tantalum, copper, tungsten, aluminum, etc., and/or with mixtures of one or more metals, conductive materials or combination of metals and conductive materials. In an example, after the second insulating interlayer 160 is planarized by a CMP process, etch back process or combination process of a CMP and an etch back, the second conductive layer may be formed on the planarized second insulating interlayer 160.

A third plug 166 filling the third contact hole 163 may be formed by partially removing the second conductive layer until the second insulating interlayer 160 is exposed. The third plug 166 electrically connects the first lower wiring 154 to the first electrode 187.

Referring to FIG. 7E, a first insulation layer may be formed on the third plug 166 and the second insulating interlayer 160. The first insulation layer may then be partially etched by a photolithographic process to form a first insulation layer pattern 169 on the second insulating interlayer 160. The first insulation layer pattern 169 may be formed using an insulation material such as oxide. The first insulation layer pattern 169 may be separated from the third plug 166 by a given distance.

A phase-change layer 172 and a second insulation layer 175 may be sequentially formed on the second insulating interlayer 160 and the third plug 166 to cover the first insulation layer pattern 169. The phase-change layer 172 may be formed with a chalcogenide alloy by a sputtering process. Here, the chalcogenide alloy may be a ternary phase-change chalcogenide alloy such as Ge—Sb—Te (GST), As—Sb—Te, Sn—Sb—Te, Sn—In—Sb—Te, As—Ge—Sb—Te, etc. Additionally, the chalcogenide alloy may include an element in Group VA-antimony-tellurium such as Ta—Sb—Te, Nb—Sb—Te, V—Sb—Te, etc., or an element in Group VA-antimony-selenium such as Ta—Sb—Se, Nb—Sb—Se, V—Sb—Se, etc. Further, the chalcogenide alloy may include an element in Group VIA-antimony-tellurium such as W—Sb—Te, Mo—Sb—Te, Cr—Sb—Te, etc., or an element in Group VIA-antimony-selenium such as W—Sb—Se, Mo—Sb—Se, Cr—Sb—Se, etc. In an example, the phase-change layer 172 may be formed with GST and the second insulation layer 175 may be formed with an oxide such as silicon oxide or a nitride such as silicon nitride, for example.

Although the phase-change layer 172 is described above as being formed of a ternary phase-change chalcogenide alloy, the phase-change layer 172 could be formed of a binary phase-change chalcogenide alloy or a quarternary phase-change chalcogenide alloy. Exemplary binary phase-change chalcogenide alloys may include one or more of Ga—Sb, In—Sb, In—Se, $Sb_2$—$Te_3$ or Ge—Te alloys; exemplary quarternary phase-change chalcogenide alloys may include one or more of an Ag—In—Sb—Te, (Ge—Sn)—Sb—Te, Ge—Sb—(Se—Te) or $Te_{81}$—$Ge_{15}$—$Sb_2$—$S_2$ alloy, for example.

Referring to FIG. 7F, the second insulation layer 175 and the phase-change layer 172 may be successively etched by a photolithographic process to form a phase-change layer pattern 178 and a second insulation layer pattern 181 on the first insulation layer pattern 169. Thus, a variable resistance member 184 including the first insulation layer pattern 169, phase-change layer pattern 178 and second insulation layer pattern 181 may be formed on the second insulating interlayer 160. The variable resistance member 184 may be separated from the third plug 166 by the given distance as discussed above with respect to FIG. 7E. As described above, because the variable resistance member 184 has a self-heat confined structure that includes the first insulation layer pattern 169, phase-change layer pattern 178 and second insulation layer pattern 181, heat due to the reset current applied to the phase-change layer pattern 178 may not be dissipated externally, but confined in the phase-change layer pattern 178.

Figure 7G:
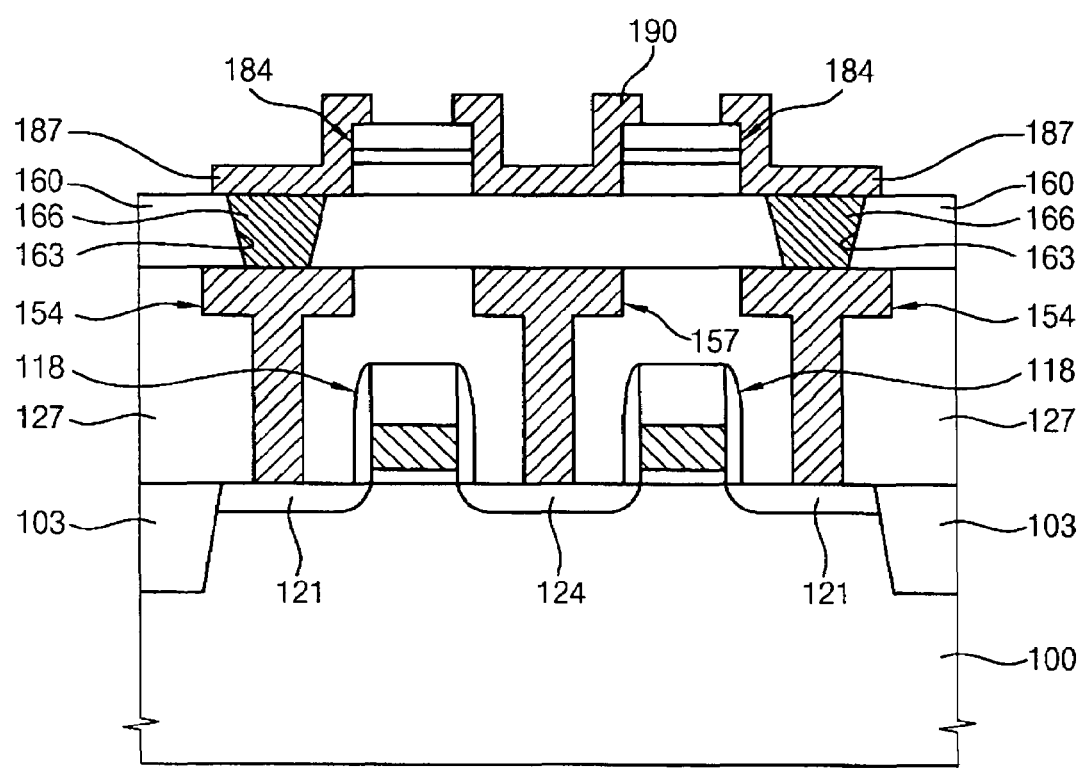

Referring to FIG. 7G, a third conductive layer may be formed on the third plug 166 and second insulating interlayer 160 to cover the variable resistance member 184. The third conductive layer may be formed by a suitable deposition process such as a CVD process, a physical vapor deposition (PVD) process, an atomic layer deposition (ALD) process, etc. In addition, the third conductive layer may be formed of a conductive material containing nitrogen, metal, metal silicide, etc. Examples of the conductive material containing nitrogen may include TiN, TaN, MoN, NbN, TiSiN, TiAlN, TiBN, ZrSiN, WSiN, WBN, ZrAlN, MoSiN, MoAlN, TaSiN, TaAlN, TiON, TiAlON, WON, TaON, etc, singly or as a combination or mixture of one or more of these materials. The metal for the third conductive layer may include one of Ti, W, Mo, Ta, etc. The metal silicide may be selected from one of TiSi and TaSi. The conductive material may be embodied as a single metal or metal silicide, or combination of one or more metals or metals with metal suicides. In an example, the third conductive layer may be composed of titanium nitride. In another example, the third conductive layer may have a double layer or a multi-layered structure that includes a conductive material film containing nitrogen, a metal film and/or a metal silicide film, for example.

The third conductive layer may be partially etched to form a first electrode 187 and a second electrode 190. In an example, the first and second electrodes 187 and 190 may be formed simultaneously. The first electrode 187 extends from the third plug 166 to a first portion of the variable resistance member 184, whereas the second electrode 190 extends from a second portion of one variable resistance member 184 to a second portion of an adjacent variable resistance member 184, as shown in FIG. 7G. As shown in FIG. 7G, two first electrodes 187 may be provided. Another first electrode 187 may be formed from a first portion of the adjacent variable resistance member 184 to another third plug 166. For example, the first and second portions of the variable resistance member 184 correspond to both lateral portions thereof, respectively. That is, the first and second electrodes 187 and 190 respectively enclose a first and a second lateral portions of the variable resistance member 184 having a rectangular box shape. An upper face of the variable resistance member 184 may be partially exposed between the first and second electrodes 187 and 190.

Figure 7H:
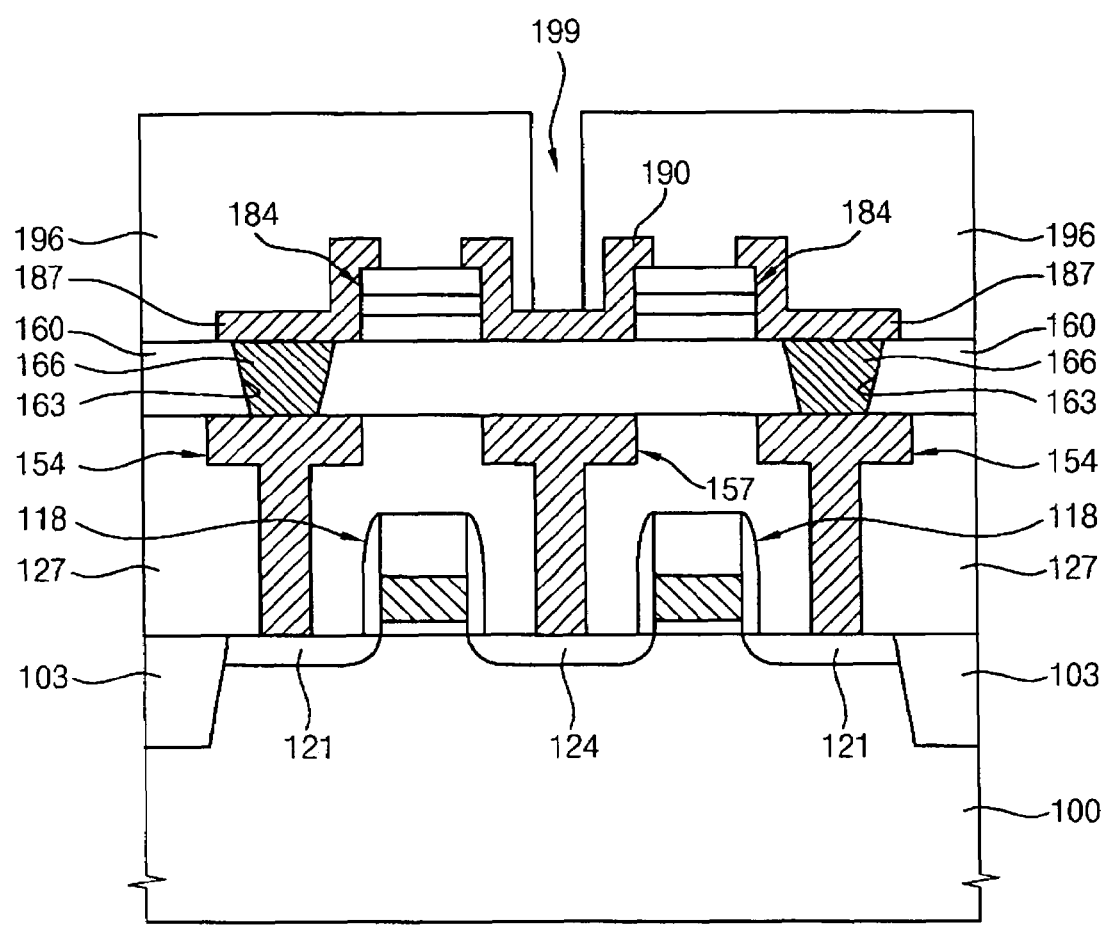
Figure 71:
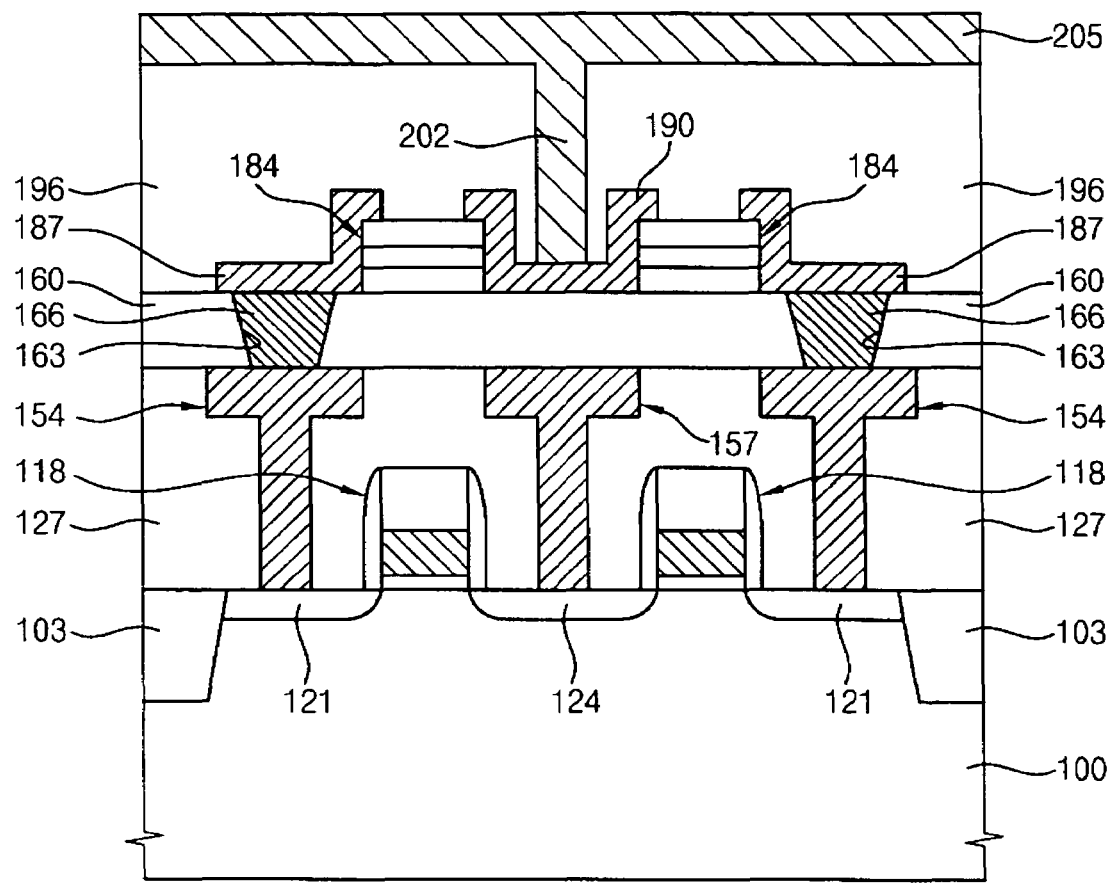

Referring to FIG. 7H, a third insulating interlayer 196 may be formed on the second insulating interlayer 160 to cover the first electrode 187, second electrode 190 and the variable resistance member 184. The third insulating interlayer 196 may be partially etched by a photolithographic process to form a fourth contact hole 199 exposing the second electrode 190. Alternatively, after the third insulating interlayer 196 may be planarized by a CMP process, an etch back process or a combination of a CMP and an etch back, the fourth contact hole 199 may be formed through the planarized third insulating interlayer 196.

Referring to FIG. 7I, a fourth conductive layer may be formed on the third insulating interlayer 196 to fill the fourth contact hole 196. The fourth conductive layer may be formed with a conductive material such as doped polysilicon or a metal such as tungsten, copper, aluminum, tantalum, etc., of a single conductive material or metal or mixtures thereof. Hence, a fourth plug 202 may be formed in the fourth contact hole 199 so as to contact the second electrode 190, and an upper wiring 205 may be simultaneously formed on the third insulating interlayer 196. The fourth plug 202 electrically connects the upper wiring 205 to the second electrode 190. Alternatively, after filling the fourth contact hole 199 with the fourth plug 202, the upper wiring 205 may be formed on the fourth plug 202 and third insulating interlayer 196.

Figure 8:
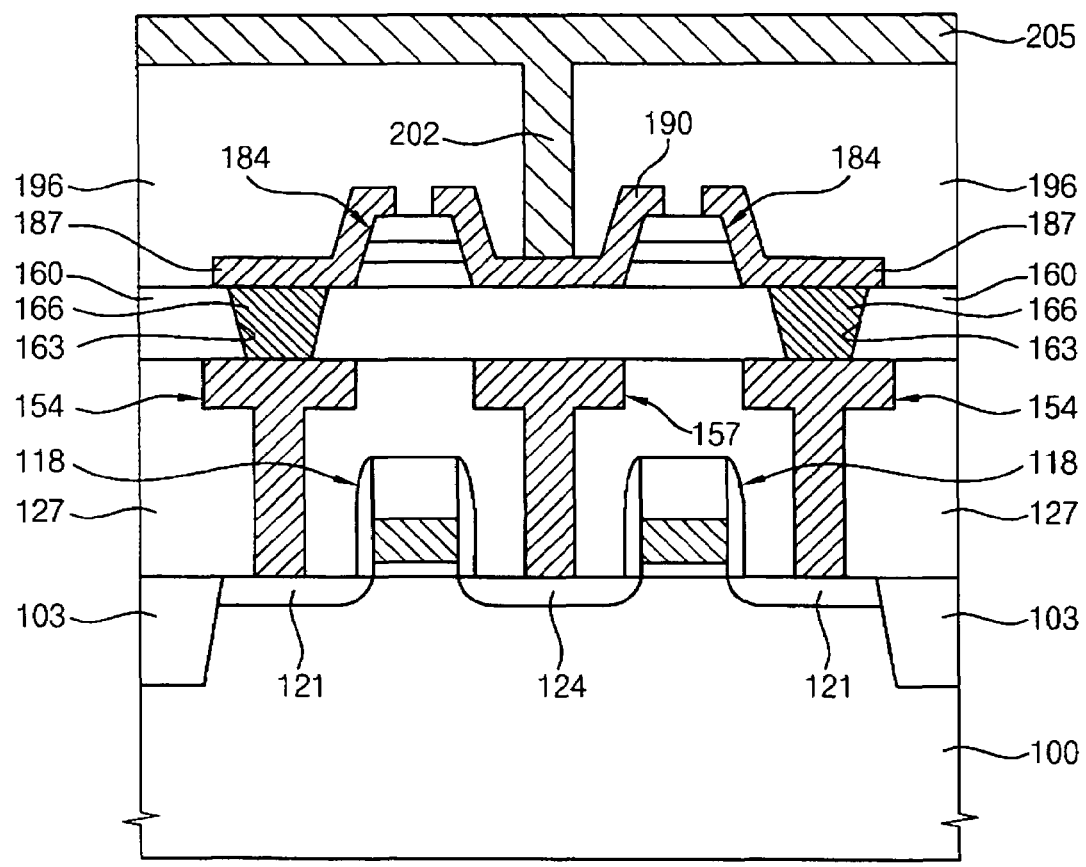
FIG. 8 is a cross-sectional view illustrating a phase-change memory device in accordance with another exemplary embodiment of the present invention.

FIG. 8 is a cross-sectional view illustrating a phase-change memory device in accordance with another embodiment of the present invention. the phase-change memory device of FIG. 8 has elements substantially identical to those of the phase-change memory device in FIG. 3, except the variable resistance member 184 has a generally pyramidal cross-section (i.e., has a generally pyramidal shape).

Referring to FIG. 8, the phase-change device includes a semiconductor substrate 100 with a first contact region 121 and a second contact region 124, a first lower wiring 154 in contact with the first contact region 121, a second lower wiring 157 in contact with the second contact region 124, a first electrode 187 electrically connected to the first lower wiring 154, a second electrode 190 corresponding to the first electrode 187, and the variable resistance member 184 formed between first electrode 187 and the second electrode 190. The variable resistance member 184 may be arranged in a direction parallel to the semiconductor substrate 100.

Figure 9A:
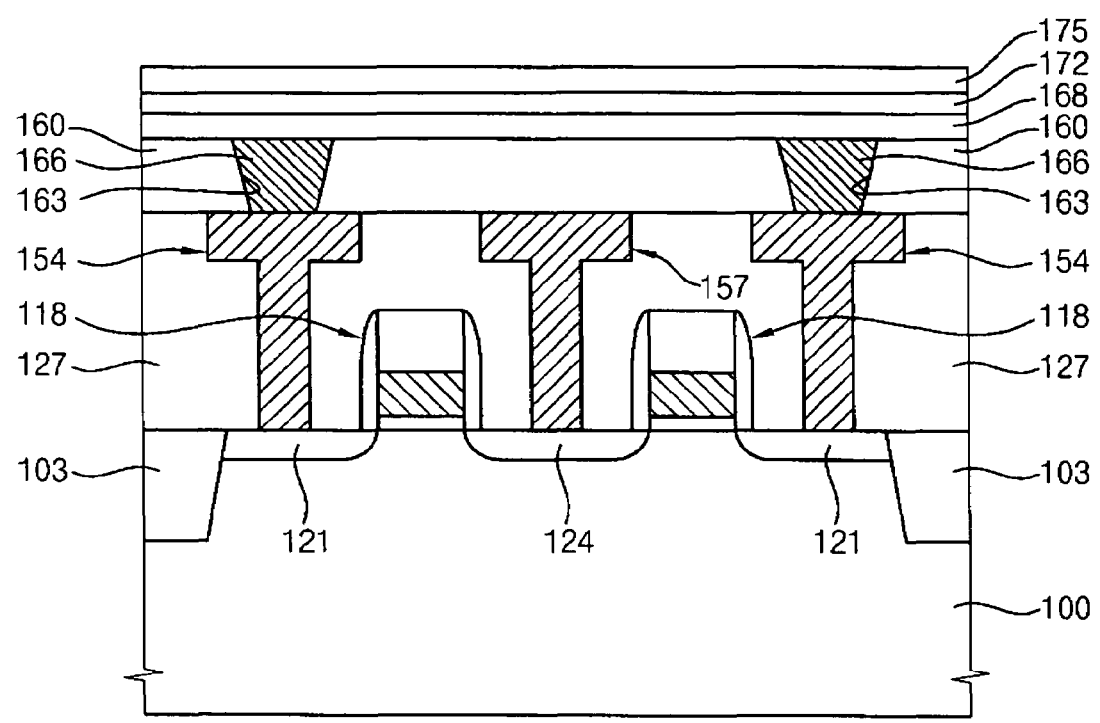
FIGS. 9A to 9D are cross-sectional views illustrating a method of manufacturing a phase-change memory device in accordance with another exemplary embodiment of the present invention.
Figure 9B:
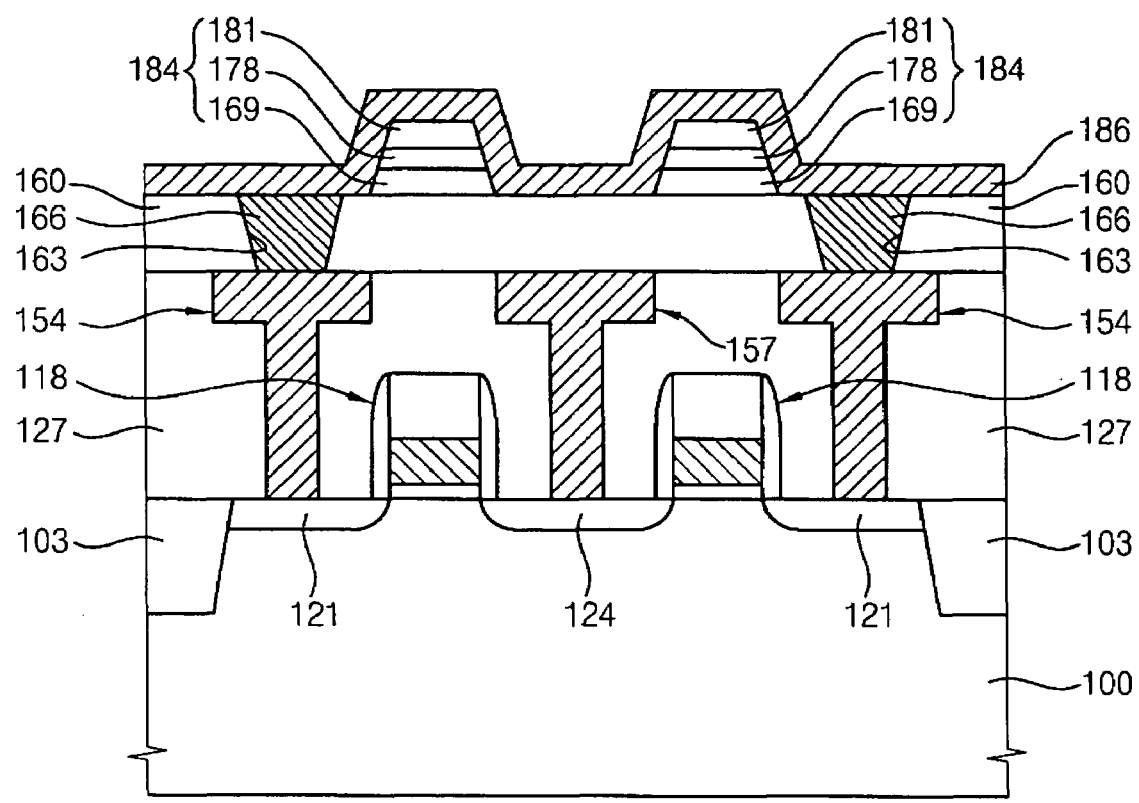

The variable resistance member 184 may include a first insulation layer pattern 169, a phase-change layer pattern 178 and a second insulation layer pattern 181 sequentially formed on a second insulating interlayer 160, as shown in more detail in FIG. 9B. The first insulation layer 169 may have an area that is substantially wider than that of the phase-change layer pattern 178, and the phase-change layer pattern 178 may have an area substantially larger than that of the second insulation layer pattern 181. As a result, the variable resistance member 184 has the pyramidal structure including lateral portions with a given slope.

The first electrode 187 may extend from a third plug 166 to a first lateral portion of the sloped variable resistance member 184, whereas the second electrode 190 may extended from a second lateral portion of the sloped variable resistance member 184 to a portion of an adjacent variable resistance member 184. The first and second electrodes 187 and 190 may be separated from each other on an upper face of the variable resistance member 184 so that the upper portion of the variable resistance member 184 is exposed between the first and second electrodes 187 and 190. The second electrode 190 is electrically connected to an upper wiring 205 through a fourth plug 202 penetrating a third insulating interlayer 166.

FIGS. 9A to 9D are cross-sectional views illustrating a method of manufacturing the phase-change memory device in FIG. 8. In this exemplary embodiment, steps for forming the second insulating interlayer 160 and the third plug 166 are substantially identical to those described with reference to FIGS. 7A to 7D and are not repeated here for reasons of brevity.

Referring to FIG. 9A, a first insulation layer 168, a phase-change layer 172 and a second insulation layer 175 may be sequentially formed on the third plug 166 and the second insulating interlayer 160. The first and second insulation layers 168 and 175 may be formed of an oxide such as silicon oxide or nitride like silicon nitride. The phase-change layer 172 may be formed of a ternary phase-change chalcogenide alloy such as GST, As—Sb—Te, Sn—Sb—Te, Sn—In—Sb—Te, As—Ge—Sb—Te, Ta—Sb—Te, Nb—Sb—Te, V—Sb—Te, Ta—Sb—Se, Nb—Sb—Se, V—Sb—Se, W—Sb—Te, Mo—Sb—Te, Cr—Sb—Te, W—Sb—Se, Mo—Sb—Se, Cr—Sb—Se, etc. Alternatively, the phase-change layer 172 could be formed of a binary phase-change chalcogenide alloy or a quarternary phase-change chalcogenide alloy, example alloys of which have been previously described above.

Referring to FIG. 9B, after a photoresist pattern (not shown) is formed on the second insulating interlayer 175, the second insulation layer 175, the phase-change layer 172 and the first insulation layer 168 may be successively etched using the photoresist pattern as an etching mask. Thus, a variable resistance member 184 including the first insulation layer pattern 169, phase-change layer pattern 178 and the second insulation layer pattern 181 may be formed on the second insulating interlayer 160. The variable resistance member 184 may be formed by an anisotropic etching process so as to have a pyramid structure positioned over the semiconductor substrate 100. Also, the variable resistance member 184 may be separated from the third plug 166 by a given interval.

A third conductive layer 186 is formed on the second insulating interlayer 160 to enclose the third plug 166 therein and to cover the variable resistance member 184. The third conductive layer 186 may be formed with exemplary conductive materials containing nitrogen, a metal or a metal silicide such as was described previously with respect to FIG. 7G, and which are not repeated here for reasons of brevity.

Figure 9C:
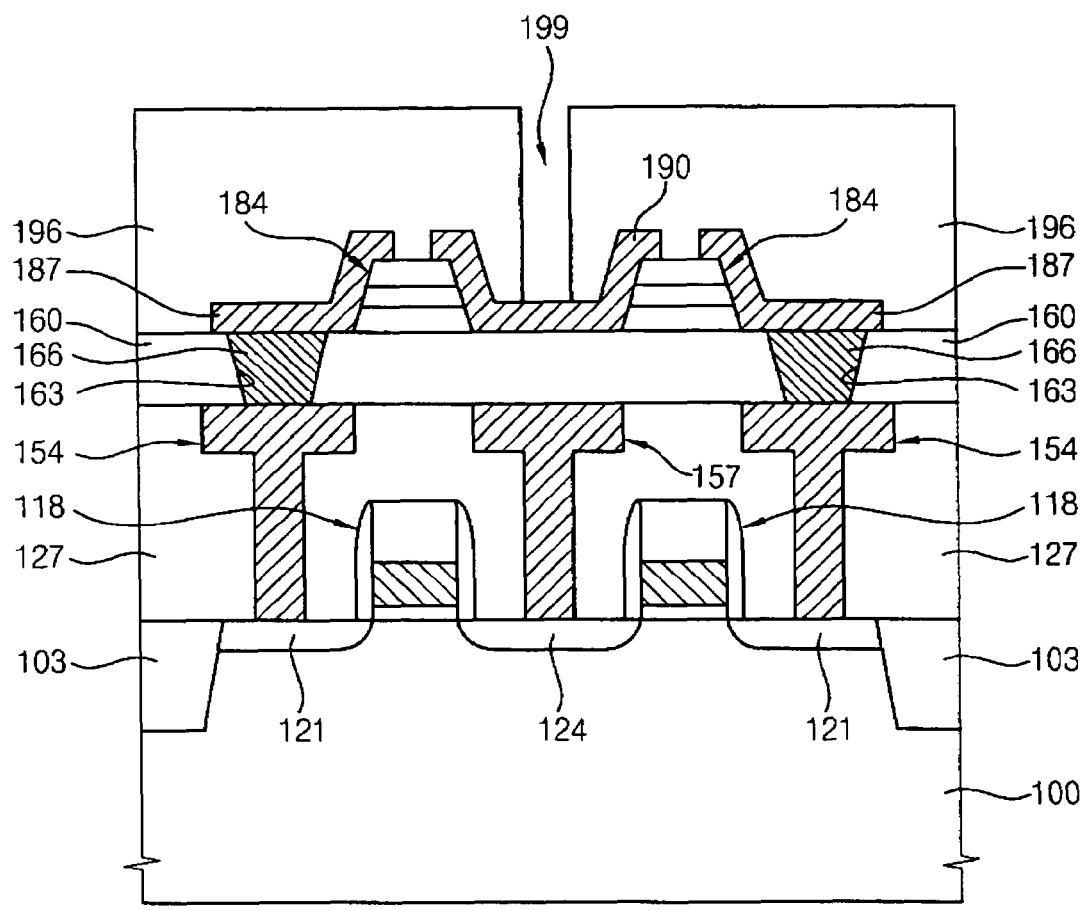

Referring to FIG. 9C, the third conductive layer 186 may be partially etched by a photolithographic process to form a first electrode 187 and a second electrode 190 on the second insulating interlayer 160 and lateral portions of the variable resistance member 184. The first electrode 187 extends from the third plug 166 to a first lateral portion of the sloped variable resistance member 184, and the second electrode 190 extends from a second portion of the sloped variable resistance member 184 to a corresponding second portion of an adjacent sloped variable resistance member 184. Thus, two adjacent sloped variable resistance members 184 includes together one second electrode 190 as a common electrode. The first and second electrodes 187 and 190 enclose the first and second lateral portions of the sloped variable resistance member 184, respectively. Here, an upper face of the sloped variable resistance member 184 may be partially exposed between the first and second electrodes 187 and 190.

After a third insulating interlayer 196 is formed on the second insulating interlayer 160 to cover the first electrode 187, the second electrode 190 and the variable resistance member 184, the third insulating interlayer 196 may be partially etched to form a fourth contact hole 199 that partially exposes the second electrode 190. The third insulating interlayer 196 may be formed using TEOS, USG, SOG, HDP-CVD oxide, etc., alone or in a mixture thereof.

Figure 9D:
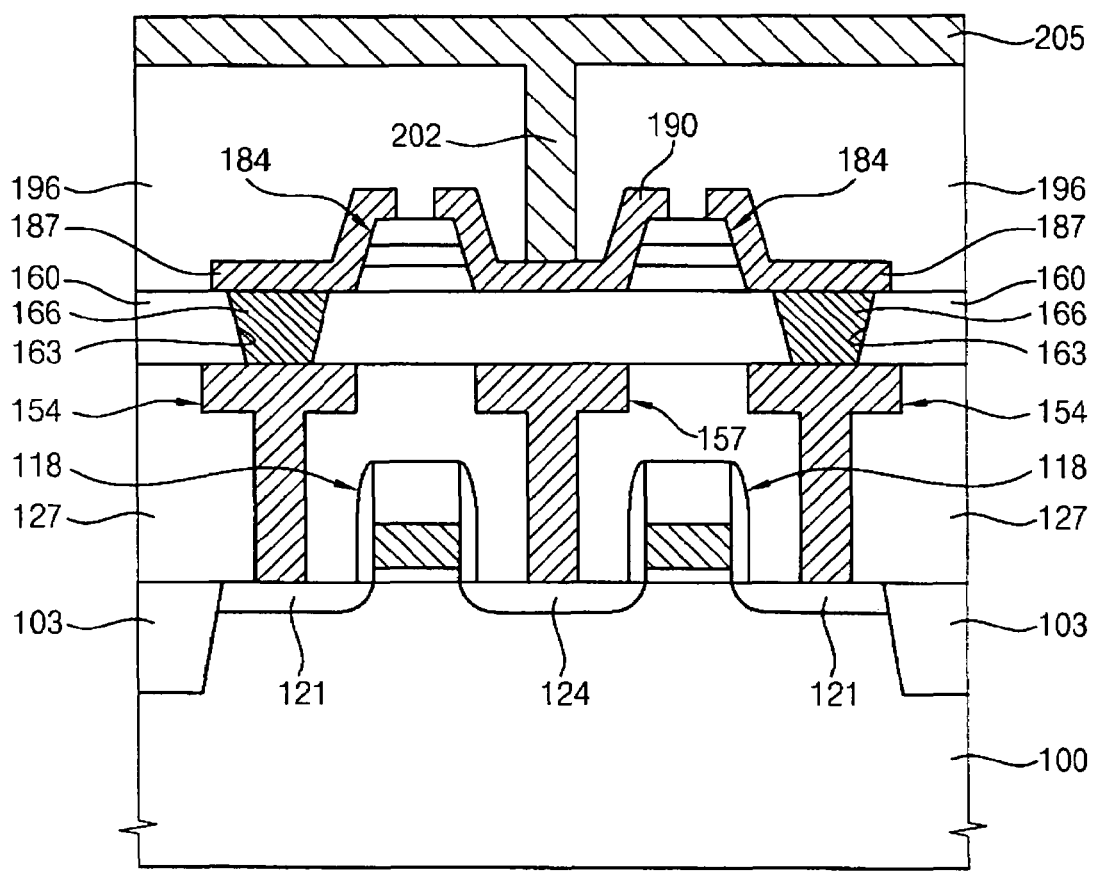

Referring to FIG. 9D, a fourth conductive layer may be formed on the third insulating interlayer 196 to fill the fourth contact hole 196, so as to form a fourth plug 202 and an upper wiring 205 and to complete the exemplary phase-change memory device with sloped variable resistance member 184. The fourth plug 202 contacting the second electrode 190 may be formed in the fourth contact hole 199, with the upper wiring 205 formed on the third insulating interlayer 196. The fourth plug 202 electrically connects the upper wiring 205 to the second electrode 190. The fourth plug 202 and the upper wiring 205 may be formed of a polysilicon doped with impurities, tungsten, copper, aluminum, tantalum, etc.

According to the exemplary embodiments of the present invention, the phase-change memory device may operate using a relatively low current without deterioration of a phase-change layer thereof and dissipation of a heat generated in the phase-change layer, since the phase-change memory device includes a variable resistance member that has a self-heat confined structure. Additionally, because a phase-change region of the phase-change pattern layer is separated from the electrodes, the phase-change pattern layer may not be detached from the electrodes.

Thus, the exemplary phase-change memory device described in the specification may have cost advantages over conventional DRAM, flash memory, etc., and even the conventional phase-change memory device, due to its substantially small active storage media and simpler device structure. The exemplary manufacturing method for the phase-change memory device requires fewer steps, resulting in reduced cycle times, fewer defects and potentially greater manufacturing flexibility. As an example, since two adjacent phase-change memory devices share a common electrode, cycle time and manufacturing cost may be reduced Smaller storage area and cell volume may result in smaller die sizes without the increasingly exaggerated topologies of conventional memory devices, thereby producing more memory circuits or devices per wafer.

The exemplary embodiments of the present invention being thus described, it will be obvious that the same may be varied in many ways. Such variations are not to be regarded as departure from the spirit and scope of the exemplary embodiments of the present invention, and all such modifications as would be obvious to one skilled in the art are intended to be included within the scope of the following claims.

What is claimed is:

1. A phase-change memory device, comprising:
   a semiconductor substrate having a contact region;
   a variable resistance member formed on the semiconductor substrate along a direction substantially in parallel to the semiconductor substrate;
   a first electrode enclosing a first lateral side of the variable resistance member and electrically connected to the contact region; and
   a second electrode enclosing a second lateral side that is formed on the opposite side of the first lateral side of the variable resistance member of the variable resistance member, wherein the variable resistance member includes a first insulation layer pattern on the semiconductor substrate, a phase-change layer pattern on the first insulation layer pattern, and a second insulation layer pattern on the phase-change layer pattern.

2. The device of claim 1, wherein the variable resistance member formed between the first and the second electrodes.

3. The device of claim 1, wherein the first and the second insulation layer patterns comprise an oxide or a nitride.

4. The device of claim 1, wherein the phase-change layer pattern includes a germanium-antimony-tellurium (Ge—Sb—Te) alloy and the first and second electrodes include titanium nitride.

5. The device of claim 1, wherein the phase-change layer pattern includes an alloy selected from a group comprising binary phase-change chalcogenide alloys, ternary phase-change chalcogenide alloys and quarternary phase-change chalcogenide alloys.

6. The device of claim 1, wherein the first and the second electrodes have cross-sections substantially larger than a cross-section of the phase-change layer pattern.

7. The device of claim 1, wherein the variable resistance member is generally configured in a generally box shape or a generally pyramidal shape.

8. The device of claim 1, wherein the second electrode extends from the second lateral side of the variable resistance member to a lateral side of an adjacent variable resistance member.

9. The device of claim 1, further comprising:
   a lower wiring for electrically connecting the contact region to the first electrode; and
   a conductive structure for electrically connecting the second electrode to an upper wiring.

10. The device of claim 1, wherein the first electrode, second electrode and variable resistance member are arranged on a common surface that is parallel to the semiconductor substrate.

11. A phase-change memory device arrangement, comprising:
    two adjacent phase-change memory devices sharing a common semiconductor substrate, each memory device including at least a first sidewall electrode and a variable resistance member and sharing a common second sidewall electrode between the corresponding first sidewall electrodes, wherein each variable resistance member is provided between a corresponding first sidewall electrode and the common second sidewall electrode so that a portion of the common second sidewall electrode encloses a first lateral portion of each of the two adjacent variable resistance members.

* * * * *